(12) United States Patent
Weiser et al.

(10) Patent No.: US 9,261,778 B2
(45) Date of Patent: *Feb. 16, 2016

(54) LAYER COMPOSITE CONSISTING OF A PHOTOPOLYMER FILM AND AN ADHESIVE LAYER

(71) Applicant: Bayer Intellectual Property GmbH, Monheim (DE)

(72) Inventors: Marc-Stephan Weiser, Leverkusen (DE); Sascha Tadjbach, Bergisch Gladbach (DE); Ute Flemm, Solingen (DE); Dennis Hönel, Zülpich-Wichterich (DE); Friedrich-Karl Bruder, Krefeld (DE); Thomas Fäcke, Leverkusen (DE); Thomas Rölle, Leverkusen (DE); Horst Berneth, Leverkusen (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/368,822

(22) PCT Filed: Dec. 27, 2012

(86) PCT No.: PCT/EP2012/076985
§ 371 (c)(1),
(2) Date: Jun. 26, 2014

(87) PCT Pub. No.: WO2013/102603
PCT Pub. Date: Jul. 11, 2013

(65) Prior Publication Data
US 2015/0017353 A1 Jan. 15, 2015

(30) Foreign Application Priority Data
Jan. 5, 2012 (EP) .................................... 12150277

(51) Int. Cl.
*G03H 1/02* (2006.01)
*G03F 7/00* (2006.01)
(Continued)

(52) U.S. Cl.
CPC .............. *G03F 7/001* (2013.01); *B42D 25/328* (2014.01); *C08G 18/2885* (2013.01);
(Continued)

(58) Field of Classification Search
CPC .... G03F 7/001; C08G 18/792; C08G 18/758; C08G 18/755; C08G 18/8175; C08G 18/73; C08G 18/71; C08G 18/715; C08G 18/4887; C08G 18/4854; C08G 18/2885; C08G 18/4277; G03H 1/265; G03H 1/0256; G03H 1/0011; B42D 25/328; G11B 7/245; G11B 7/24044

See application file for complete search history.

(56) References Cited

U.S. PATENT DOCUMENTS 4,959,283 A * 9/1990 Smothers et al. .................. 430/1
5,066,525 A * 11/1991 Nakamachi et al. ............ 428/29
(Continued)

FOREIGN PATENT DOCUMENTS

CA 1155581 A1 10/1983
DE 3002734 A1 7/1981
(Continued)

OTHER PUBLICATIONS
Machine translation of WO 2011/054749 (May 2011).*
(Continued)

*Primary Examiner* — Martin Angebranndt
(74) *Attorney, Agent, or Firm* — Drinker Biddle & Reath LLP

(57) ABSTRACT

The present invention relates to a layer composite comprising an exposed photopolymer film and an adhesive layer which is connected to the photopolymer film at least in certain regions, wherein the photopolymer film comprises crosslinked polyurethane matrix polymers A), crosslinked writing monomers B) and a monomeric fluoroethane additive C), wherein the adhesive layer is in the form of a diffusion barrier for the fluoroethane additive C). The invention also relates to the use of the layer composite for producing chip cards, ID documents or 3D images, as a product protective label, as a label, in banknotes in the form of a strip or window or as holographically optical elements in displays.

13 Claims, 3 Drawing Sheets shows the measurement setup for testing the holographic properties, for wavelengths of 633 and 532 nm.

(51) Int. Cl.
*G03H 1/00* (2006.01)
*G03H 1/26* (2006.01)
*C08G 18/28* (2006.01)
*C08G 18/42* (2006.01)
*C08G 18/48* (2006.01)
*C08G 18/71* (2006.01)
*C08G 18/73* (2006.01)
*C08G 18/75* (2006.01)
*C08G 18/81* (2006.01)
*C08G 18/79* (2006.01)
*G11B 7/24044* (2013.01)
*G11B 7/245* (2006.01)
*B42D 25/328* (2014.01)

(52) U.S. Cl.
CPC ....... *C08G 18/4277* (2013.01); *C08G 18/4854* (2013.01); *C08G 18/4887* (2013.01); *C08G 18/71* (2013.01); *C08G 18/715* (2013.01); *C08G 18/73* (2013.01); *C08G 18/755* (2013.01); *C08G 18/758* (2013.01); *C08G 18/792* (2013.01); *C08G 18/8175* (2013.01); *G03H 1/0011* (2013.01); *G03H 1/0256* (2013.01); *G03H 1/265* (2013.01); *G11B 7/245* (2013.01); *G11B 7/24044* (2013.01); *G03H 2001/0264* (2013.01); *G03H 2250/35* (2013.01); *G03H 2260/12* (2013.01); *G03H 2260/14* (2013.01); *Y10T 428/1429* (2015.01); *Y10T 428/24802* (2015.01); *Y10T 428/24843* (2015.01); *Y10T 428/263* (2015.01); *Y10T 428/2809* (2015.01); *Y10T 428/2848* (2015.01)

(56) References Cited

U.S. PATENT DOCUMENTS

| | | | |
|---|---|---|---|
| 5,773,544 A | | 6/1998 | Christell et al. |
| 7,173,744 B1* | | 2/2007 | Whiteside et al. ............... 359/3 |
| 2002/0120045 A1 | | 8/2002 | Musch et al. |
| 2003/0134072 A1* | | 7/2003 | Morii et al. .................. 428/40.1 |
| 2005/0085584 A1 | | 4/2005 | Musch et al. |
| 2006/0019172 A1 | | 1/2006 | Ohtaki et al. |
| 2007/0026319 A1* | | 2/2007 | Nagate et al. ..................... 430/1 |
| 2008/0070124 A1* | | 3/2008 | Matsumoto et al. ............. 430/2 |
| 2010/0036013 A1* | | 2/2010 | Roelle et al. ................... 522/174 |
| 2012/0214089 A1 | | 8/2012 | Hönel et al. |
| 2012/0219884 A1* | | 8/2012 | Weiser et al. ..................... 430/2 |
| 2012/0231377 A1 | | 9/2012 | Weiser et al. |
| 2013/0177746 A1* | | 7/2013 | Facke et al. ................. 428/195.1 |
| 2014/0295329 A1* | | 10/2014 | Weiser et al. ..................... 430/2 |

FOREIGN PATENT DOCUMENTS

| | | | |
|---|---|---|---|
| EP | 2154129 A1 | | 2/2010 |
| WO | WO-02/24825 A1 | | 3/2002 |
| WO | WO-2005/035683 A1 | | 4/2005 |
| WO | WO-2008/125229 A1 | | 10/2008 |
| WO | 2011/054749 | * | 5/2011 |
| WO | WO-2011/054797 A1 | | 5/2011 |
| WO | WO-2011/067057 A1 | | 6/2011 |

OTHER PUBLICATIONS

International Search Report for PCT/EP2012/076985 mailed Feb. 14, 2013.

* cited by examiner

LAYER COMPOSITE CONSISTING OF A PHOTOPOLYMER FILM AND AN ADHESIVE LAYER

The present invention relates to a laminate comprising an exposed photopolymer film and a layer of adhesive joined at least regionally to the photopolymer film, the photopolymer film comprising crosslinked polyurethane matrix polymers A), crosslinked writing monomers B) and a monomeric fluorourethane additive C). A further subject of the invention is the use of the laminate for producing chip cards, identity documents or 3D images; as a product protection tag; as a label; in bank notes, in the form of a strip or window; or as holographic optical elements in displays.

Photopolymer films of the type identified at the outset, for producing holographic media, are known from WO 2011/054797 and WO 2011/067057. Advantages of these holographic media are their high diffractive light-bending efficiency and that no extra processing steps are needed after holographic exposure, such as chemical or thermal development steps, for example.

In many cases the exposed photopolymer films are integrated into more complex products such as chip cards or identity documents. For that purpose the photopolymer film is typically bonded to a substrate. For such bonding it is possible to use either a liquid adhesive formulation or an adhesive sheet.

Experiments have shown, however, that a large number of the commercially available adhesive sheets and adhesive formulations produce a colour shift in the hologram when they are brought into contact with the aforementioned exposed photopolymer films. Particularly in the case of RGB holograms and true-colour holograms, however, even a small wavelength shift by >20 nm ("colour shift") is a problem, since the overall perceived colour of the hologram is distorted.

It was therefore an object of the present invention to provide a laminate of the aforementioned kind that can be bonded to a substrate without any wavelength shift of more than 20 nm for a hologram exposed into the photopolymer film.

The object is achieved by a laminar construction in which the layer of adhesive is designed as a diffusion barrier for the fluorourethane additive C).

A BRIEF DESCRIPTION OF THE FIGURES

Figure 1:
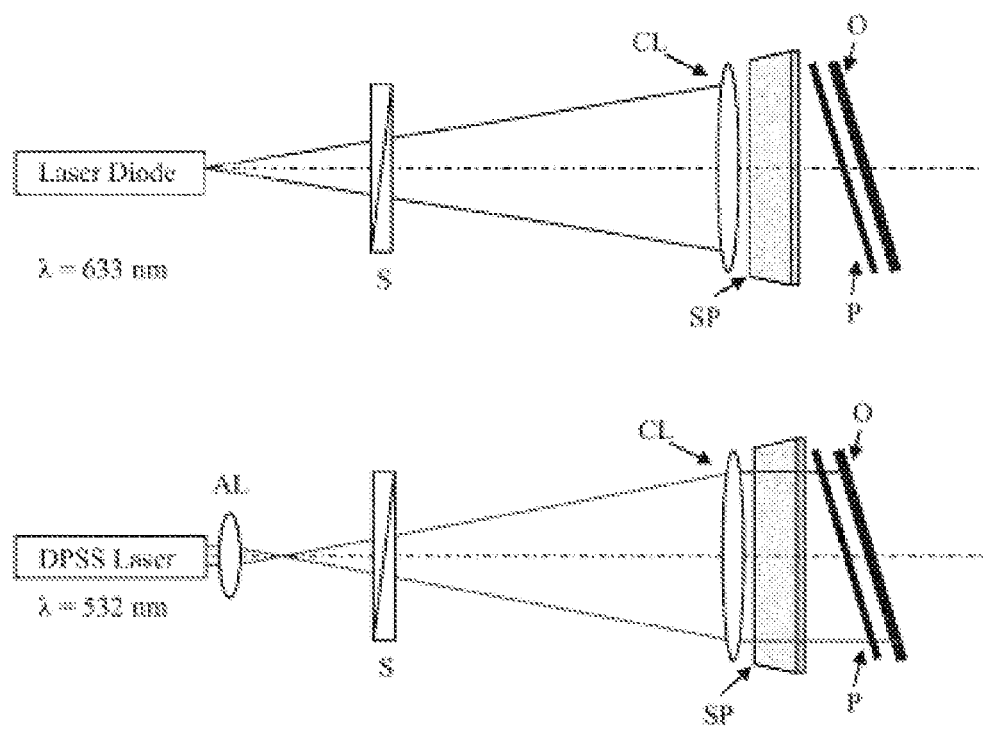
Figure 1 shows the measurement setup for testing the holographic properties, for wavelengths of 633 and 532 nm.

FIG. 1 shows the measurement setup for testing the holographic properties, for wavelengths of 633 and 532 nm.

Figure 2:
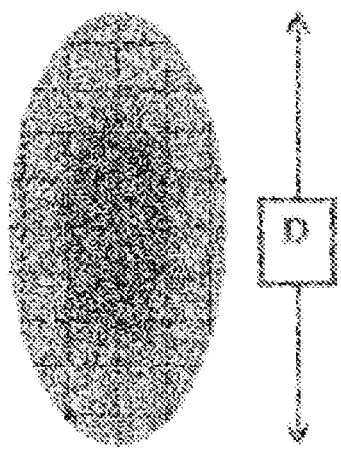
Figure 2 shows the elliptical shape of a hologram written under Figure 1.

FIG. 2 shows the elliptical shape of a hologram written under FIG. 1.

Figure 3:
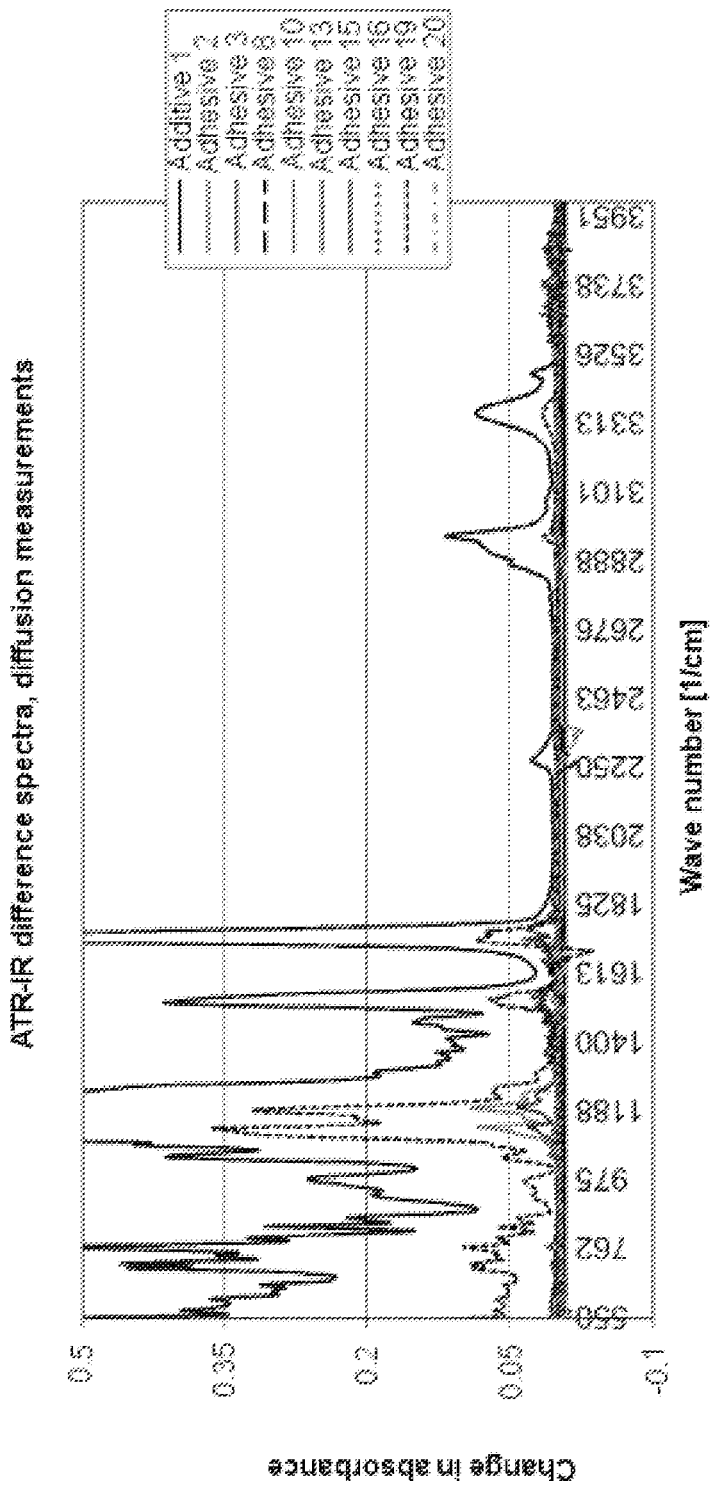
Figure 3 shows the evaluations of the difference spectra, obtained by ATR-IR measurement, for different adhesives, and also the comparison spectrum of additive 1.

FIG. 3 shows the evaluations of the different spectra, obtained by ATR-IR measurement, for different adhesives, an also the comparison spectrum of additive 1.

A DETAILED DESCRIPTION OF THE INVENTION

According to one preferred embodiment of the invention, provision is made such that the layer of adhesive is designed so that on ATR-IR measurement there is no time-dependent change in the absorption spectrum if the layer of adhesive is wetted with the fluorourethane additive. For the determination, in a first step, the infrared spectrum of the fluorourethane additive and that of the layer of adhesive are each recorded using an infrared spectrometer with an ATR measuring cell (ATR: attenuated total reflection). Then, subsequently, a piece of the layer of adhesive is adhered uniformly in a defined layer thickness to the ATR measuring cell. The fluorourethane additive is then applied to the free top face of the layer of adhesive. The amount of the additive here must be such that the area of the layer of adhesive located over the ATR measuring cell is fully covered after the additive has flowed out. For monitoring the diffusion of the additive into the layer of adhesive, IR spectra of the layer of adhesive are recorded at predetermined time intervals over a sufficient time period. Since the depth of penetration of the total-reflection radiation is situated in the μm range, the fluorourethane additive can only be detected in the IR spectrum when by diffusion it has reached the bottom face of the layer of adhesive, lying on the ATR measuring cell. Subtracting the IR spectrum of the layer of adhesive at the beginning of the measurement from the time-dependent spectra during the diffusion of the fluorourethane additive produces a difference spectrum. If this difference spectrum is placed in relation to the IR spectrum of the fluorourethane additive, it is possible to estimate the time-dependent concentration of the fluorourethane additive on the bottom face of the layer of adhesive.

It is particularly preferred if during the measurement time there are no peaks in the difference spectrum arising from an absorbance change of >3.2%, preferably >2.5% and more preferably >1.5%.

With the layers of adhesive of the invention, intensity differences of more than 3% in the absorption peaks in the difference spectrum are not found at any point in time.

According to a further preferred embodiment of the laminate of the invention, the layer of adhesive comprises at least one compound selected from the group consisting of synthetic rubbers, chloroprene rubbers, polyester-based hotmelt adhesives, silicone-based adhesives, urethane-based adhesives of high network density, optionally with additional radiation-curing groups or based on urethane acrylates, polyolefin-based adhesives and cyanoacrylate adhesives. With particular preference the laminate comprises or consists of at least one compound selected from the group consisting of synthetic rubbers, polyester-based hotmelt adhesives, urethane-based adhesives comprising urethane acrylates, and cyanoacrylate adhesives.

Synthetic rubbers are understood to include not only the poly(isoprenes) but also copolymers which as further monomers comprise or consist of acrylonitrile and derivatives, butadiene, styrene, isobutene, et cetera. Typical copolymers are butadiene-nitrile rubbers (NBR), styrene-butadiene rubbers (SBR) and isoprene-isobutylene rubbers (IIR). Further information in Müller/Rath, Formulierung von Kleb-und Dichtrohstoffen, 2009, ISBN: 978-3-86630-862-6, Sections 1.1.2.3 and 1.2.2. Particularly preferred are the examples identified under Adhesive 9, 10, 14 and 15.

Chloroprene rubbers are polymers of 2-chloro-1,3-butadiene and optionally an ethylenically unsaturated monomer copolymerizable with chloroprene. They are used preferably in the form of dispersions, which may be obtained by emulsion polymerization in an alkaline medium as described in WO02/24825 (page 3, line 26-page 7, line 4), DE-A 3 002 734 (page 8, line 23-page 12, line 9), WO2005035683(A1) (page 16 ff.) or U.S. Pat. No. 5,773,544 (column 2, line 9 to column 4, line 45). Dispersions whose use is preferred are described in BMS 11 1 206, page 29f.

By polyester-based hotmelt adhesives are meant those which consist to a substantial weight fraction of >30%, preferably >50%, of polyester units. Exemplarily, polyesters are described in Section b) of this application, and for deployment as a hotmelt adhesive it is possible to use any desired end group such as ester, ether, amide or acid end group or others. Preference is given to using copolyester types whose composition is also based on other polymer units such as urethane, polyether, polyamide or vinyl acetate bonds. Particular preference is given to using the example described as Adhesive 6.

By silicone-based adhesives are meant those whose linking units comprise silicone groups or consist exclusively of such groups. Silicones are organosilicon compounds which have only Si—O bonds in the backbone. Silicones are frequently used in the form of (block or graft) copolymers with polyethers or polyesters or other polymer units (modified silicones). The modifications occur via the organic side groups on the silicon atoms. Further information in Müller/Rath, Formulierung von Kleb-und Dichtrohstoffen, 2009, ISBN: 978-3-86630-862-6, Section 3.2.3. Particular preference is given to using silicone-based pressure-sensitive adhesives as specified in Example 5, for example.

Urethane-based adhesives of high network density are two-component polyurethanes which form three-dimensional networks with high network densities, of the kind also used in principle in the matrix polymers A). Three-dimensional network structures of high network density are obtainable more particularly by reacting components which have number-average equivalent molar masses of <1500 g/mol and more preferably of <1200 g/mol. One preferred example is Adhesive 8.

It is preferred to use mixtures of isocyanates and isocyanate-functional, radiation-curing components, more particularly urethane acrylates. Suitable compositions are obtainable by reacting at least one radiation-curing component with at least one isocyanate-functional resin and at least one photoinitiator. In this context it is particularly preferred for the radiation-curing component to contain ≤5% by weight of compounds having a weight-average molecular weight <500 and ≥75% by weight of compounds having a weight-average molecular weight >1000, and also for the isocyanate-functional resin to contain ≤5% by weight of compounds having a weight-average molecular weight <500.

Polyolefin-based adhesives are polymers preferably based on the monomers propylene and ethylene, and are frequently used as hotmelt adhesives. Their use as pressure-sensitive adhesives is possible. The use of other purely C—H-based-comonomers is conceivable, but addition of vinyl acetate, as usual in polyolefin copolymers, is not suitable.

Cyanoacrylates are the chemical basis of the "superglues" that are known on the market. These are reactive 1-component systems which cure with particular rapidity by an anionic mechanism, generally initiated by atmospheric moisture. More information on raw materials used and on the curing chemistry is found in Müller/Rath, Formulierung von Kleb- und Dichtrohstoffen, 2009, ISBN: 978-3-86630-862-6, Section 2.3.2. Particularly suitable cyanoacrylate adhesives are the examples identified as Adhesives 17, 18 and 20.

Adhesives of the invention can be used with preference in the form of pressure-sensitive adhesives (as pressure-sensitive adhesive tapes or sheets), hotmelt adhesives (hot melts, hotmelt adhesive sheets) or liquid adhesive formulations, which dry physically, thermally, chemically or with radiation curing.

Pressure-sensitive adhesives (PSAs) are permanently tacky products which develop adhesion to substrates on contact with them and with application of just a gentle pressure. The bonding process is independent in terms of time from the application of the adhesive, generally on a carrier material such as a release liner, peel-off paper or (film-based) carrier. As a result of the process, however, it may be useful to process PSAs at elevated temperatures. Further information in Müller/Rath, Formulierung von Kleb-und Dichtrohstoffen, 2009, ISBN: 978-3-86630-862-6, Section 3.

Hotmelt adhesives are amorphous or semi-crystalline polymers whose glass transition temperature or crystalline point lies above room temperature. On heating beyond this temperature range, there is a liquification (in some cases slow), and a viscosity behaviour is acquired that is suitable for adhesive bonding. On cooling, there is then recrystallization or solidification. In principle it is possible in this way even for high-molecular polymers whose glass transition temperature is below room temperature to function as hotmelt adhesives. Such polymers are obtainable for example through drying of dispersions or physical solutions. Further information in Müller/Rath, Formulierung von Kleb- and Dichtrohstoffen, 2009, ISBN: 978-3-86630-862-6, Sections 1.1.2.3 and 1.3.1.

It is likewise preferred if the fluorourethane additive C) comprises or consists of at least one compound of the formula (I)

in which m≥1 and m≤8 and $R_1$, $R_2$ and $R_3$ independently of one another are hydrogen, linear, branched, cyclic or heterocyclic organic radicals which are unsubstituted or else, optionally, substituted by heteroatoms, where preferably at least one of the radicals $R_1$, $R_2$ and $R_3$ is substituted by at least one fluorine atom, and more preferably $R_1$ is an organic radical having at least one fluorine atom.

The isocyanate component a) preferably comprises polyisocyanates. Polyisocyanates which can be used are all of those compounds known to the skilled person, or mixtures thereof, that contain on average two or more NCO functions per molecule. They may be aromatic, araliphatic, aliphatic or cycloaliphatic in their basis. In minor amounts it is also possible as well to use monoisocyanates and/or polyisocyanates containing unsaturated groups.

Suitability is possessed for example by butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanato-cyclohexyl) methanes and their mixtures with any desired isomer content, isocyanatomethyl-octane 1,8-diisocyanate, cyclohexylene 1,4-diisocyanate, the isomeric cyclohexanedimethylene diisocyanates, phenylene 1,4-diisocyanate, tolylene 2,4- and/or 2,6-diisocyanate, naphthylene 1,5-diisocyanate, diphenylmethane 2,4'- or 4,4'-diisocyanate and/or triphenyl-methane 4,4',4''-triisocyanate.

Likewise possible is the use of derivatives of monomeric diisocyanates or triisocyanates having urethane, urea, carbodiimide, acylurea, isocyanurate, allophanate, biuret, oxadiazinetrione, uretdione and/or iminooxadiazinedione structures.

Preferred is the use of polyisocyanates based on aliphatic and/or cycloaliphatic diisocyanates or triisocyanates.

With particular preference the polyisocyanates of component a) are dimerized or oligomerized, aliphatic and/or cycloaliphatic diisocyanates or triisocyanates.

Especially preferred are isocyanurates, uretdiones and/or iminooxadiazinediones based on HDI, and also 1,8-diisocyanato-4-(isocyanatomethyl)octane, or mixtures thereof.

As component a) it is likewise possible to use NCO-functional prepolymers having urethane, allophanate, biuret and/ or amide groups. Prepolymers of component a) are obtained in a manner very familiar to the skilled person through reaction of monomeric, oligomeric or polyisocyanates a1) with isocyanate-reactive compounds a2) in suitable stoichiometry, with optional use of catalysts and solvents.

Suitable polyisocyanates a1) include all of the aliphatic, cycloaliphatic, aromatic or araliphatic diisocyanates and triisocyanates that are known per se to the skilled person, it being immaterial whether they have been obtained by phosgenation or by phosgene-free methods. In addition it is also possible to use the derivatives of monomeric diisocyanates and/or triisocyanates that have a relatively high molecular mass and that are well known per se to the skilled person, and that have a urethane, urea, carbodiimide, acylurea, isocyanurate, allophanate, biuret, oxadiazinetrione, uretdione or iminooxadiazinedione structure, and they may be used each individually or in any desired mixtures with one another.

Examples of suitable monomeric diisocyanates or triisocyanates which may be used as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyloctane 1,8-diisocyanate (TIN), toluene 2,4- and/or 2,6-diisocyanate.

As isocyanate-reactive compounds a2) for the synthesis of the prepolymers it is preferred to use OH-functional compounds. These are analogous to the OH-functional compounds as described below for component b).

Allophanates can also be used in a mixture with other prepolymers or oligomers of component a1). In these cases it is advantageous to use OH-functional compounds having functionalities of 1 to 3.1. When using monofunctional alcohols, those having 3 to 20 carbon atoms are preferred.

Likewise possible is the use of amines for prepolymer preparation. Examples of those suitable include ethylenediamine, diethylenetriamine, triethylenetetramine, propylenediamine, diaminocyclohexane, diaminobenzene, diaminobisphenyl, difunctional polyamines such as, for example, the Jeffamines®, amine-terminated polymers having number-average molar masses of up to 10000 g/mol, or any desired mixtures thereof with one another.

For the preparation of prepolymers containing biuret groups, isocyanate is reacted in excess with amine, forming a biuret group. Amines suitable in this case for reaction with the aforementioned di-, tri- and polyisocyanates are all oligomeric or polymeric, primary or secondary, difunctional amines of the aforementioned kind. Examples are aliphatic biurets based on aliphatic amines and aliphatic isocyanates, more particularly HDI and TMDI.

Preferred prepolymers are urethanes, allophanates or biurets of aliphatic isocyanate-functional compounds and oligomeric or polymeric isocyanate-reactive compounds having number-average molar masses of 200 to 10000 g/mol.

The above-described prepolymers preferably have residual free monomeric isocyanate contents of less than 2% by weight, more preferably less than 1.0% by weight, very preferably less than 0.5% by weight.

The isocyanate component may of course include proportionally, in addition to the above-described prepolymers, further isocyanate components. It is also possible, optionally, for the isocyanate component a) to include, proportionally, isocyanates which have undergone partial reaction with isocyanate-reactive ethylenically unsaturated compounds.

It is also possible, optionally, for the aforementioned isocyanate component a) to include, completely or proportionally, isocyanates which have undergone complete or partial reaction with blocking agents known to the skilled person from coating technology. Examples of blocking agents include the following: alcohols, lactams, oximes, malonic esters, alkyl acetoacetates, triazoles, phenols, imidazoles, pyrazoles and also amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, $\epsilon$-caprolactam, N-tert-butylbenzylamine, cyclopentanone carboxyethyl ester or any desired mixtures of these blocking agents.

As component b) it is possible per se to use all polyfunctional, isocyanate-reactive compounds which contain on average at least 1.5 isocyanate-reactive groups per molecule.

Isocyanate-reactive groups in the context of the present invention are preferably hydroxyl, amino or thio groups, particular preference being given to hydroxyl compounds.

Examples of suitable polyfunctional, isocyanate-reactive compounds are polyester, polyether, polycarbonate, poly(meth)acrylate and/or polyurethane polyols.

Also suitable, in addition, as constituents of component b), as polyfunctional, isocyanate-reactive compounds, are aliphatic, araliphatic or cycloaliphatic di-, tri- or polyfunctional alcohols which are of low molecular weight, in other words having molecular weights of less than 500 g/mol, and that are short-chain compounds, in other words containing 2 to 20 carbon atoms.

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butyl-propanediol, trimethylpentanediol, positionally isomeric diethyloctanediols, 1,3-butylene glycol, cyclohexanediol, 1,4-cyclohexane-dimethanol, 1,6-hexanediol, 1,2- and 1,4-cyclohexanediol, hydrogenated bisphenol A (2,2-bis(4-hydroxycyclohexyl)propane), and 2,2-dimethyl-3-hydroxypropyl 2,2-dimethyl-3-hydroxypropionate. Examples of suitable triols are trimethylolethane, trimethylolpropane or glycerol. Suitable higher polyfunctional alcohols are ditrimethylolpropane, pentaerythritol, dipentaerythritol or sorbitol.

Suitable polyester polyols are, for example, linear polyester diols or branched polyester polyols, of the kind obtained conventionally from aliphatic, cycloaliphatic or aromatic dicarboxylic and/or polycarboxylic acids, and/or their anhydrides, with polyhydric alcohols having an OH functionality $\geq 2$. Preferred polyester polyols are based on aliphatic alcohols and mixtures of aliphatic and aromatic acids, and have number-average molar masses of between 500 and 10000 g/mol and functionalities of between 1.8 and 6.1.

The polyester polyols may also be based on natural raw materials such as castor oil. It is likewise possible for the polyester polyols to be based on homopolymers or copolymers of lactones, of the kind obtainable preferably by addition reaction of lactones and/or lactone mixtures in the context of a ring-opening lactone polymerization, such as butyrolactone, $\epsilon$-caprolactone and/or methyl-$\epsilon$-caprolactone, with hydroxyl-functional compounds such as polyhydric alcohols with an OH functionality $\geq 2$ or polyols with a functionality of greater than 1.8, of the aforementioned kind, for example.

Examples of polyols used here as starters are polyether polyols with a functionality of 1.8 to 3.1 and with number-average molar masses of 200 to 4000 g/mol, preference being given to poly(tetrahydrofurans) having a functionality of 1.9 to 2.2 and number-average molar masses of 500 to 2000 g/mol. Preferred addition products are butyrolactone, $\epsilon$-caprolactone and/or methyl-$\epsilon$-caprolactone, $\epsilon$-caprolactone particularly so.

Suitable polycarbonate polyols are obtainable in a conventional way through reaction of organic carbonates or phosgene with diols or diol mixtures.

Suitable organic carbonates are dimethyl, diethyl and diphenyl carbonate.

Suitable diols and mixtures thereof comprise the polyhydric alcohols with an OH-functionality ≥2 that are specified per se in the context of the polyester segments, preferably 1,4-butanediol, 1,6-hexanediol and/or 3-methylpentanediol, or else polyester polyols can be converted into polycarbonate polyols.

Suitable polyether polyols are polyadducts, optionally of blockwise construction, of cyclic ethers with OH- or NH-functional starter molecules.

Examples of suitable cyclic ethers are styrene oxides, ethylene oxide, propylene oxide, tetrahydrofuran, butylene oxide, epichlorohydrin, and also any desired mixtures thereof.

As starters it is possible to use the polyhydric alcohols with an OH functionality ≥2 that are specified per se in the context of the polyester polyols, and also primary or secondary amines and amino alcohols.

Preferred polyether polyols are those of the aforementioned kind based exclusively on propylene oxide, or random or block copolymers based on propylene oxide with further 1-alkylene oxides, the 1-alykene oxide fraction being not greater than 80% by weight. Particularly preferred are propylene oxide homopolymers and also random or block copolymers containing oxyethylene, oxypropylene and/or oxybutylene units, the fraction of the oxypropylene units, based on the total amount of all oxyethylene, oxypropylene and oxybutylene units, being at least 20% by weight, preferably at least 45% by weight. Oxypropylene and oxybutylene here include all respective linear and branched C3 and C4 isomers.

As specific polyether polyols it is preferred to use those which consist of an isocyanate-reactive component comprising hydroxy-functional multiblock copolymers of the type $Y(X_i\text{-}H)_n$ with i=1 to 10 and n=2 to 8, and with number-average molecular weights of greater than 1500 g/mol, the segments $X_i$ each being composed of oxyalkylene units of the formula (X),

   Formula (X)

where R is a hydrogen, alkyl or aryl radical, which may also be substituted or interrupted by heteroatoms (such as ether oxygens), Y is the parent starter, and the fraction of the segments $X_i$, based on the total amount of segments $X_i$ and Y, is at least 50% by weight.

In formula (X) R is preferably a hydrogen, a methyl, butyl, hexyl or octyl group or an alkyl radical containing ether groups. Preferred alkyl radicals containing ether groups are those based on oxyalkylene units.

The multiblock copolymers $Y(X_i\text{-}H)_n$ preferably have number-average molecular weights of more than 1200 g/mol, more preferably more than 1950 g/mol, but preferably not more than 12000 g/mol, more preferably not more than 8000 g/mol.

Block copolymers of the structure $Y(X_i\text{-}H)_n$ that are used with preference consist to an extent of more than 50 percent by weight of the above-described blocks $X_i$, and have a number-average total molar mass of greater than 1200 g/mol.

Preferred combinations of component a) and b) in the preparation of the matrix polymers are as follows:
I) Addition products of butyrolactone, ε-caprolactone and/or methyl-ε-caprolactone with polyether polyols having a functionality of 1.8 to 3.1, with number-average molar masses of 200 to 4000 g/mol, in conjunction with isocyanurates, uretdiones, iminooxadiazinediones and/or other oligomers based on HDI. More preferably addition products of ε-caprolactone with poly(tetrahydrofurans) having a functionality of 1.9 to 2.2, with number-average molar masses of 500 to 2000 g/mol (more particularly 600 to 1400 g/mol), whose number-average total molar mass is from 800 to 4500 g/mol, more particularly from 1000 to 3000 g/mol, in conjunction with oligomers, isocyanurates and/or iminooxadiazinediones based on HDI.
II) Polyether polyols having number-average molar masses of 500 to 8500 g/mol and OH functionalities of 1.8 to 3.2, exclusively based on propylene oxide, or random or block copolyols based on propylene oxide and ethylene oxide, the ethylene oxide fraction being not higher than 60% by weight, in conjunction with urethanes, allophanates or biurets of aliphatic isocyanate-functional compounds and oligomeric or polymeric isocyanate-reactive compounds, having number-average molar masses of 200 to 6000 g/mol. Particularly preferred are propylene oxide homopolymers having number-average molar masses of 1800 to 4500 g/mol and OH functionalities of 1.9 to 2.2, in conjunction with allophanates of HDI or TMDI and difunctional polyether polyols (more particularly polypropylene glycols), with number-average molar masses of 200 to 2100 g/mol.
III) Polyether block or multiblock copolymers of the formula (I), where Y is a purely aliphatic polycarbonate polyol or a polymer of tetrahydrofuran, having in each case an OH functionality of 1.8 to 3.1 and a number-average molar mass of 400 to 2000 g/mol, n is 2, i is 1 or 2 and R is methyl or H, having a total number-average molar mass of 1950 to 9000 g/mol, in conjunction with urethanes, allophanates or biurets of aliphatic isocyanate-functional compounds and oligomeric or polymeric isocyanate-reactive compounds, having number-average molar masses of 200 to 6000 g/mol, or in conjunction with isocyanurates, uretdiones, iminooxadiazinediones and/or other oligomers based on HDI. Particularly preferred are polyether block or multiblock copolymers of the formula (I) where Y is a purely aliphatic polycarbonate polyol based on 1,4-butanediol and/or 1,6-hexanediol, with dimethyl carbonate or diethyl carbonate, or a polymer of tetrahydrofuran having an OH functionality of 1.8 to 2.2 and a number-average molar mass of 600 to 1400 g/mol (more particularly up to 1000 g/mol), n is 2, i is 1 or 2 and R is methyl or H, the fraction of the ethylene oxide units as a proportion of the total amounts of $X_i$ being not higher than 60% by weight, in conjunction with allophanates of HDI or TMDI and difunctional polyether polyols (more particularly polypropylene glycols), with number-average molar masses of 200 to 2100 g/mol, in conjunction with biurets having number-average molar masses of 200 to 1400 g/mol (including more particularly in a mixture with other oligomers of difunctional aliphatic isocyanates), based on aliphatic diamines or polyamines and aliphatic diisocyanates, more particularly HDI and TMDI, in conjunction with urethanes of HDI or TMDI based on addition products of butyrolactone, ε-caprolactone and/or methyl-ε-caprolactone (more particularly ε-caprolactone) with aliphatic, araliphatic or cycloaliphatic di-, tri- or polyfunctional alcohols containing 2 to 20 carbon atoms (more particularly with difunctional aliphatic alcohols having 3 to 12 carbon atoms), having number-average molar masses of 200 to 3000 g/mol, with more particular preference of 1000 to 2000 g/mol (more particularly in a mixture with other oligomers of difunctional aliphatic isocyanates), or in conjunction with isocyanurates, iminooxadiazinediones and/or other oligomers based on HDI.

The crosslinked writing monomers B) are obtained preferably by reaction of one or more different compounds having radiation-curing groups, with exposure to actinic radiation.

Compounds having radiation-curing groups may be compounds such as α,β-unsaturated carboxylic acid derivatives such as acrylates, methacrylates, maleates, fumarates, maleimides, acrylamides, and also vinyl ethers, propenyl ethers, allyl ethers and compounds containing dicyclopentadienyl units, and also olefinically unsaturated compounds such as, for example, styrene, α-methylstyrene, vinyltoluene, olefins, such as, for example, 1-octene and/or 1-decene, vinyl esters, (meth)acrylonitrile, (meth)acrylamide, methacrylic acid, acrylic acid.

Preference is given to acrylates and/or methacrylates.

It is especially preferred if the writing monomers B) are photochemically crosslinked acrylates.

Acrylates and methacrylates are the terms, generally, for esters of acrylic acid and methacrylic acid, respectively. Examples of acrylates and methacrylates which can be used are methyl acrylate, methyl methacrylate, ethyl acrylate, ethyl methacrylate, ethoxy ethyl acrylate, ethoxy ethyl methacrylate, n-butyl acrylate, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diyl bis[(2,6-dibromo-4,1-phenylene)oxy(2-{[3,3,3-tris(4-chlorophenyl)propanoyl]oxy}-propane-3,1-diyl)oxyethane-2,1-diyl] diacrylate, bisphenol A diacrylate, bisphenol A dimethacrylate, tetrabromobisphenol A diacrylate, tetrabromobisphenol A dimethacrylate, and the ethoxylated analogue compounds thereof, and N-carbazolyl acrylates, to give but a selection of acrylates and methacrylates for possible use.

Preference is given to using acrylates and methacrylates having a refractive index nD20 (measured at a wavelength of 405 nm) of greater than 1.450. Particularly preferred for use acrylates which comprise at least one aromatic structural unit and have a refractive index nD20 (405 nm) of greater than 1.500. Particularly suitable examples of such include acrylates and methacrylates based on bisphenol A or derivatives thereof, and also those acrylates and methacrylates which contain a thioaryl group.

It is of course also possible to use urethane acrylates as compounds with radiation-curing groups. Urethane acrylates are understood to be compounds having at least one acrylic ester group that additionally possess at least one urethane bond. It is known that such compounds may be obtained by reacting a hydroxy-functional acrylic ester with an isocyanate-functional compound.

Examples of urethane acrylates and/or urethane methacrylates are the addition products of aromatic triisocyanates (very preferably tris(4-phenylisocyanato)thiophosphate or trimers of aromatic diisocyanates such as tolylene diisocyanate) with hydroxyethyl acrylate, hydroxypropyl acrylate, 4-hydroxybutyl acrylate; the addition products of 3-thiomethylphenyl isocyanate with hydroxyethyl acrylate, hydroxypropyl acrylate, 4-hydroxybutyl acrylate; and also unsaturated glycidyl ether acrylate urethanes (as described in the applications WO 2008/125229 A1 and in EP 2 154 129), or any desired mixtures thereof with one another.

In a development, the invention provides for the photopolymer film to further comprise a photoinitiator D) and/or a catalyst E).

As component D), use may be made of one or more photoinitiators. The photoinitiator system used may preferably comprise an anionic, cationic or neutral dye and a coinitiator. Examples are mixtures of tetrabutylammonium triphenylhexylborate, tetrabutylammonium triphenylbutylborate, tetrabutylammonium trinaphthylbutylborate, tetrabutylammonium tris(4-tert-butyl)phenylbutylborate, tetrabutylammonium tris(3-fluorophenyl)hexylborate and tetrabutylammonium tris(3-chloro-4-methylphenyl)hexylborate with dyes such as, for example, astrazone orange G, methylene blue, new methylene blue, azure A, pyrillium I, safranin O, cyanin, gallocyanin, brilliant green, crystal violet, ethyl violet and thionin.

Use may be made of one or more catalysts E). These are catalysts for accelerating the formation of urethane. Examples of known catalysts for this purpose include tin octoate, zinc octoate, dibutyltin dilaurate, dimethylbis[(1-oxoneodecyl)oxy]stannane, dimethyltin dicarboxylate, zirconium bis(ethylhexanoate), zirconium acetylacetonate or tertiary amines such as, for example, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido[1,2-a]pyrimidine and monobutyltin tris(2-ethylhexanoate).

Preference is given to dibutyltin dilaurate, dimethylbis[(1-oxoneodecyl)oxy]stannane, dimethyltin dicarboxylate, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido[1,2-a]-pyrimidine and monobutyltin tris(2-ethylhexanoate).

Further constituents of the photopolymer film may be radical stabilizers or other auxiliaries and adjuvants such as plasticizers.

Suitable examples of radical stabilizers are inhibitors and antioxidants of the kind described for example in "Methoden der organischen Chemie" (Houben-Weyl), 4th Edition, Volume XIV/1, p. 433ff., Georg Thieme Verlag, Stuttgart 1961. Suitable classes of compound are, for example, phenols, such as 2,6-di-tert-butyl-4-methylphenol, cresols, hydroquinones, benzyl alcohols, such as benzhydrol, optionally also quinones, such as 2,5-di-tert-butylquinone, for example, and optionally also aromatic amines such as diisopropylamine or phenothiazine.

Those preferred are 2,6-di-tert-butyl-4-methylphenol, phenothiazine, p-methoxyphenol, 2-methoxy-p-hydroquinone and benzhydrol.

Exposed into the photopolymer film there may be in particular a hologram. By means of corresponding exposure procedures it is possible to produce holograms for optical applications in the whole of the visible range and also in the near UV range (300-800 nm). Visual holograms encompass all holograms which can be recorded by methods known to the skilled person; they include, among others, in-line (Gabor) holograms, off-axis holograms, full-aperture transfer holograms, white-light transmission holograms ("rainbow holograms"), Denisyuk holograms, off-axis reflection holograms, edge-lit holograms and also holographic stereograms; those preferred are reflection holograms, Denisyuk hologram and transmission holograms. Preference is given to optical elements such as lenses, mirrors, deflectors, filters, diffuser screens, diffraction elements, light guides, wave guides, projection screens and/or masks. These optical elements often exhibit a frequency selectivity, depending on how the holograms have been exposed and what dimensions the hologram has.

According to a further preferred embodiment, provision is made for the layer of adhesive to have a thickness in the range from 3 to 100 µm, preferably from 10 to 75 µm and more preferably from 15 to 55 µm.

It is likewise preferred if the layer of adhesive is joined over its full area with the photopolymer film.

The laminate of the invention may also comprise further layers. For example, the layer of adhesive may be provided partably with a cover layer. It is also possible for the laminate to have a second layer of adhesive. In that case both layers of adhesive may in particular be joined to the opposite sides of the photopolymer film.

The layer of adhesive may be applied in particular with laminating apparatus or via a roll-to-roll process to the photopolymer film.

The layer of adhesive may be applied via a transfer method or in the form of a liquid adhesive.

In the case of liquid application, the formulation may consist of one or more components, which may be mixed by suitable techniques prior to application. For the application procedure to the photopolymer film, suitability is possessed by all respective commonplace techniques that are known to the skilled person, such as more particularly knife coating, pouring, printing, screen-printing, spray application, droplet or strip application via nozzles, injection, or inkjet printing. Of preferred suitability are droplet or strip application via nozzles, doctor blades, spray application, printing processes and more particularly screen-printing, and also slot dies. Depending on the adhesive, suitable drying parameters are possible (physical, thermal drying, evaporation, UV light for radiation curing, curing by atmospheric oxygen). Drying or curing may take place entirely in contact with the photopolymer film and with the adhesive substrate, or else in the form of (partial) curing, for as long as there is only contact with one of the two substrates (photopolymer layer or adhesive substrate), with subsequent completion of contact.

The adhesive layer transfer method is especially suitable when no liquid chemicals are to be handled or when the thickness of the layer of adhesive is to be set precisely. Here, in a preliminary step, the layer of adhesive is applied to a redetachable substrate and is optionally protected with a further detachable laminating film. In the adhesive layer transfer process, the laminating film is then removed and the adhesive is laminated directly onto the photopolymer film. It is possible for the substrate of the adhesive to remain in the product; alternatively, it acts as a transfer substrate before the layer construction is applied in the ultimate application.

The layer of adhesive can of course be applied by liquid application or else by adhesive layer transfer processes to the substrate where bonding is to take place, as well. Suitable substrates are paper, thermoplastics, thermosets, metals, glass, wood, and painted, coated, laminated or printed substrates, etc. Here it may be of advantage to pretreat the substrates. Examples of such treatments include chemical pretreatment with solvents, for preliminary cleaning such as degreasing, physical pretreatment such as plasma treatment or corona treatment, radiation activation, deposition or application of adhesion-promoting layers.

According to a further preferred embodiment of the invention, a hologram may have been exposed into the photopolymer film. The holograms may be any desired holographic volume holograms, recorded in accordance with methods known to the skilled person. Included among these, among others, are holograms of the following kinds that are exposed monochromatically or are generated using a plurality of lasers with different emission wavelengths: multi-colour or full-colour reflection holograms, in-line (Gabor) holograms, off-axis holograms, full-aperture transfer holograms, white-light transmission holograms ("rainbow holograms"), Lippmann holograms, Denisyuk holograms, off-axis reflection holograms, edge-lit holograms and also holographic stereograms.

Possible optical functions of the holograms correspond to the optical functions of photoelements such as lenses, mirrors, deflectors, filters, diffusing screens (with and without a limited sight zone (eye box), diffraction elements, light guides, wave guides, projection screens, masks, optical prisms for spectral chromatic splitting, wave guiding and light guiding and also light shaping. These optical elements often show a frequency selectivity, according to how the holograms have been exposed and the dimensions possessed by the hologram. Moreover, using the layer constructions of the invention, it is possible to produce holographic images or representations, as for example for personal portraits, biometric representations in security documents, or generally of images or image structures for advertising, security labels, brand protection, product branding, labels, design elements, decorations, illustrations, collecting cards, pictures and the like, and also images which are able to represent digital data, alone and in combination with the products set out above. Holographic images may give the impression of a three-dimensional image, or else may represent image sequences, short films or a number of different objects, according to the angle from which and the light source (including movable sources), etc., with which they are illuminated. On the basis of these diverse design possibilities, holograms, more particularly volume holograms, represent an attractive technical solution for the abovementioned application.

In each product, generally speaking, the laminate of the invention can be integrated with a holographic application. It is preferably bonded into chip cards or identity documents. Preference is also given to use as a product protection tag, as a label, in bank notes in the form of a strip or window. It is also preferred to integrate holographic optical elements into constructions such as displays, in accordance with the layer construction described. Furthermore, 3D holograms can be adhesively bonded to the laminate of the invention using (black) background films, without any shifts of colour in the holograms.

The invention further provides for the use of a laminate of the invention for producing chip cards, identity documents or 3D images; as a product protection tag; as a label; in bank notes, in the form of a strip or window; or as holographic optical elements in displays.

Examples

The invention is illustrated below, using examples.

Methods:

Solids Content or Solids:

The tare weight of an uncoated can lid and a paperclip was determined. Then approximately 1 g of the sample under investigation was weighed out and distributed uniformly in the can lid, using the suitably bent paperclip. For the purpose of measurement, the paperclip remained in the sample. The initial weight was determined, followed by heating in a laboratory oven at 125° C. for 1 hour, after which the final weight was ascertained. The solids content was determined in accordance with the following equation: final weight [g]*100/initial weight [g]=% by weight of solids.

Isocyanate Content

The reported NCO values (isocyanate content) were determined in accordance with DIN EN ISO 11909.

Measurement of Photopolymer Dry Film Thickness

The physical layer thickness was determined using commercial white-light interferometers, such as the FTM-Lite NIR layer thickness measuring instrument from Ingenieursbüro Fuchs, for example.

The layer thickness determination is based in principle on interference phenomena on thin layers. Here there is a superimposition of light waves which have been reflected at two interfaces with different optical densities. The undisrupted superimposition of the reflected component beams then leads to a periodic lightening and extinction in the spectrum of a white continuum source (e.g. halogen lamp). This superimposition is referred to by the skilled person as interference. These interference spectra are measured and are evaluated mathematically.

ATR-IR Measurement for Determining the Difference Spectra

Test specimens of the liquid adhesives were produced for the measurements. This was done by applying films with a dry thickness of 20 μm to a glass plate, using a wire-wound doctor blade or four-way bar applicator, and the adhesive was cured as described in the section "Application of the layers of adhesive". The adhesive transfer tapes used were applied, as obtained from the manufacturer, to the measuring cell.

An ALPHA FT-IR spectrometer from BrukerOptik GmbH, Ettlingen, Germany was used, with an ATR (attenuated total reflection) measuring cell made of ZnSe. The spectra were recorded in the wave number range from 550 to 4000 cm$^{-1}$, with a resolution of 4 cm$^{-1}$.

As described above, an ATR-IR spectrum was recorded on the layer of adhesive, after which the fluorourethane additive 1 was applied dropwise to the free top face of the layer of adhesive, in such a way that the area located above the ATR measuring cell was fully wetted. For monitoring the diffusion of the additive 1 into the layer of adhesive, IR spectra of the layer of adhesive were recorded over a sufficient time period at predetermined time intervals of 1, 3 and 5 days.

The selected difference spectra were obtained by subtracting the spectrum of the adhesive film as recorded at the beginning of measurement from the spectra of the adhesive film obtained after 1, 3 and 5 days. In some cases, for experimental reasons, the measurements were concluded after just 3 days.

In order to ensure that the difference peaks did in fact originate from the diffusion of additive 1, and in order to estimate the concentration of the additive on the bottom face of the layer of adhesive, the difference spectra were compared with the infrared spectrum of the fluorourethane additive 1.

Ingredients Used for Producing the Photopolymer Films:

Polyurethane matrix polymer A): from Desmodur® N 3900 (polyisocyanate a), product of Bayer MaterialScience AG, Leverkusen, Germany, hexane diisocyanate-based polyisocyanate, iminooxadiazinedione fraction at least 30%, NCO content: 23.5%, and polyol 1 (polyol b)).

Polyol 1: experimental product of Bayer MaterialScience AG, Leverkusen, Germany; preparation is described below.

Writing monomer 1: experimental product of Bayer MaterialScience AG, Leverkusen, Germany; preparation is described below.

Writing monomer 2: experimental product of Bayer MaterialScience AG, Leverkusen, Germany; preparation is described below.

Additive 1: experimental product of Bayer MaterialScience AG, Leverkusen, Germany; preparation is described below.

Photoinitiator 1: New methylene blue 0.20%, safranin O 0.10% and astrazone orange G 0.10%, with CGI 909 (product of BASF SE, Basle, Switzerland) 1.5%, in solution in N-ethylpyrrolidone (NEP), NEP fraction 3.5%.

Catalyst 1: Fomrez® UL28 0.5%, urethanization catalyst, dimethylbis[(1-oxoneodecyl)oxy]stannane, commercial product of Momentive Performance Chemicals, Wilton, Conn., USA (used as 10% strength solution in N-ethylpyrrolidone).

Catalyst 2: Fascat 4102, monobutyltin tris(2-ethylhexanoate), product of Arkema GmbH, Düsseldorf, Germany.

Byk® 310 (silicone-based surface additive from BYK-Chemie GmbH, Wesel, Germany, 25% strength solution in xylene) 0.3%.

Substrate 1: Makrofol DE 1-1 CC 175 μm (Bayer MaterialScience AG, Leverkusen, Germany).

Substrate 2: Polyethylene terephthalate film, 36 μm, Hostaphan® RNK, from Mitsubishi Chemicals, Germany.

Substrate 3: Makrofol DE 1-1 CC 125 μm (Bayer MaterialScience AG, Leverkusen, Germany).

Preparation of the Components:

Polyol 1:

In a 1 L flask, 0.18 g of tin octoate, 374.8 g of ε-caprolactone and 374.8 g of a difunctional polytetrahydrofuran polyether polyol (equivalent weight 500 g/mol OH) were introduced and heated to 120° C., and the mixture was held at this temperature until the solids content (fraction of non-volatile constituents) was 99.5% by weight or more. The batch was then cooled and the product was obtained as a waxy solid.

Writing Monomer 1 (phosphorothioyltris(oxy-4,1-phenyleneiminocarbonyloxyethane-2,1-diyl)triacrylate):

In a 500 mL round-bottomed flask, 0.1 g of 2,6-di-tert-butyl-4-methylphenol, 0.05 g of dibutyltin dilaurate (Desmorapid® Z, Bayer MaterialScience AG, Leverkusen, Germany) and 213.07 g of a 27% strength solution of tris(p-isocyanatophenyl)thiophosphate in ethyl acetate (Desmodur® RFE, product of Bayer MaterialScience AG, Leverkusen, Germany) were introduced and heated to 60° C. Then 42.37 g of 2-hydroxyethyl acrylate were added dropwise, and the mixture was held further at 60° C. until the isocyanate content had dropped below 0.1%. The batch was then cooled and the ethyl acetate was removed completely under reduced pressure. The product was obtained as a semicrystalline solid.

Writing Monomer 2 (2-({[3-(methylsulphanyl)phenyl]carbamoyl}oxy)ethyl prop-2-enoate):

In a 100 mL round-bottomed flask, 0.02 g of 2,6-di-tert-butyl-4-methylphenol, 0.01 g of Desmorapid® Z and 11.7 g of 3-(methylthio)phenyl isocyanate were introduced and heated to 60° C. Then 8.2 g of 2-hydroxyethyl acrylate were added dropwise and the mixture was held further at 60° C. until the isocyanate content had dropped below 0.1%. The batch was then cooled. The product was obtained as a pale yellow liquid.

Additive 1 (bis(2,2,3,3,4,4,5,5,6,6,7,7-dodecafluoroheptyl) (2,2,4-trimethylhexane-1,6-diyl)biscarbamate):

In a 2000 mL round-bottomed flask, 0.02 g of Desmorapid® Z and 3.60 g of 2,4,4-trimethylhexane 1,6-diisocyanate (TMDI) were introduced and heated to 70° C. Then 11.39 g of 2,2,3,3,4,4,5,5,6,6,7,7-dodecafluoroheptan-1-ol were added dropwise and the mixture was held further at 70°

C. until the isocyanate content had dropped below 0.1%. The batch was then cooled. The product was obtained as a colourless oil.

Production of the Photopolymer Films:

Photopolymer Film 1:

16.57 g of polyol 1 were successively admixed in the dark with 7.50 g of writing monomer 1, 7.50 g of writing monomer 2 and 12.50 g of additive 1, then 0.050 g of catalyst 1 and 0.15 g of Byk® 310, and finally with a solution of 0.75 g of CGI 909, 0.10 g of new methylene blue (as tetraphenylborate), 0.050 g of safranin O (as tetraphenylborate) and 0.050 g of astrazone orange G (as tetraphenylborate) in 1.705 g of N-ethylpyrilidone (collectively photoinitiator 1), and these components were mixed to give a clear solution. Then 3.070 g of component a) were added at 30° C., and mixing was repeated. The liquid composition obtained was then applied to substrate 1 and dried at 80° C. for 4.5 minutes. Dry film thickness: 16 μm.

Photopolymer Film 2:

16.57 g of polyol 1 were successively admixed in the dark with 7.50 g of writing monomer 1, 7.50 g of writing monomer 2 and 12.50 g of additive 1, then 0.050 g of catalyst 1 and 0.15 g of Byk® 310, and finally with a solution of 0.75 g of CGI 909, 0.10 g of new methylene blue (as tetraphenylborate), 0.050 g of safranin O (as tetraphenylborate) and 0.050 g of astrazone orange G (as tetraphenylborate) in 1.705 g of N-ethylpyrilidone (collectively photoinitiator 1), and these components were mixed to give a clear solution. Then 3.070 g of component a) were added at 30° C., and mixing was repeated. The liquid composition obtained was then applied to substrate 2 and dried at 80° C. for 4.5 minutes. Dry film thickness: 23 μm.

Photopolymer Film 3:

6.63 g of polyol 1 were successively admixed in the dark with 3.50 g of writing monomer 1, 3.50 g of writing monomer 2 and 4.00 g of additive 1, then 0.020 g of catalyst 1 and 0.060 g of Byk® 310, and finally with a solution of 0.30 g of CGI 909, 0.040 g of new methylene blue (as dodecylbenzenesulphonate), 0.020 g of safranin O (as dodecylbenzenesulphonate) and 0.020 g of astrazone orange G (as dodecylbenzenesulphonate) in 0.682 g of N-ethylpyrilidone (collectively photoinitiator 1), and these components were mixed to give a clear solution. Then 1.228 g of component a) were added at 30° C., and mixing was repeated. The liquid composition obtained was then applied to substrate 2 and dried at 80° C. for 4.5 minutes. Dry film thickness: 15.5 μm.

Photopolymer Film 4:

6.63 g of polyol 1 were successively admixed in the dark with 3.50 g of writing monomer 1, 3.50 g of writing monomer 2 and 4.00 g of additive 1, then 0.020 g of catalyst 1 and 0.060 g of Byk® 310, and finally with a solution of 0.30 g of CGI 909, 0.040 g of new methylene blue (as dodecylbenzenesulphonate), 0.020 g of safranin O (as dodecylbenzenesulphonate) and 0.020 g of astrazone orange G (as dodecylbenzenesulphonate) in 0.682 g of N-ethylpyrilidone (collectively photoinitiator 1), and these components were mixed to give a clear solution. Then 1.228 g of component a) were added at 30° C., and mixing was repeated. The liquid composition obtained was then applied to substrate 1 and dried at 80° C. for 4.5 minutes. Dry film thickness: 17 μm.

Photopolymer Film 5:

397.2 g of polyol 1 were successively admixed in the dark with 195.0 g of writing monomer 1, 195.0 g of writing monomer 2 and 270.0 g of additive 1, then 0.84 g of catalyst 2 and 3.60 g of Byk® 310, and finally with a solution of 18.0 g of CGI 909, 2.4 g of new methylene blue (as dodecylbenzenesulphonate), 1.2 g of safranin O (as dodecylbenzenesulphonate) and 1.2 g of astrazone orange G (as dodecylbenzenesulphonate) in 42.0 g of N-ethylpyrilidone (collectively photoinitiator 1), and these components were mixed to give a clear solution. Then 73.57 g of component a) were added at 30° C., and mixing was repeated. The liquid composition obtained was then applied to substrate 1 and dried at 80° C. for 4.5 minutes. Dry film thickness: 23 μm.

Holographic Exposure of the Photopolymer Films:

A hologram was introduced into the photopolymer film by exposure, using a measurement set-up according to FIG. 1. The holograms in question were monochromatic holograms with a 633 nm or 532 nm laser wavelength. To do this, sections of the film were cut off in the dark, the laminating film was removed, and the films were laminated bubble-free with the photopolymer side downwards, onto a glass sheet with a size of 50×75 mm and a thickness of 1 mm. The glass sheets used were Corning glass sheets from Schott A G, Mainz, Germany.

The beam of a laser (emission wavelength 633 nm or 532 nm) was expanded to a diameter of ~3-4 cm by means of an optical expansion lens (AF) and the collimating lens (CL), which is sited after the shutter S. The diameter of the expanded laser beam was determined by the aperture of the opened shutter. An inhomogeneous intensity distribution of the expanded laser beam was deliberately ensured. Thus the edge intensity PR was ~ only half of the intensity PZ at the centre of the expanded laser beam. P here was understood to be power/area. The expanded laser beam passed first through a glass plaque which was placed at a slant to the beam and which served as a shearing plate (SP). From the interference pattern generated by the two glass surface reflections of the SP, and transmitted upwardly by means of a mirror, it was possible to see whether the laser emits stably in single mode. In that case, a pattern of dark and light stripes was visible on a mat screen placed above the SP. Only if emission was single mode were holographic exposures performed. In the case of the DPSS laser, the single mode was achievable by adjustment of the pump current. The expanded beam passed through the photopolymer film (P), which was at a slant of about 15°—this part formed the reference beam—before being reflected back into P by the object (O) arranged parallel to P. This part then formed the signal beam of the Denisyuk arrangement.

The interference of signal beam and reference beam in P produced the hologram in the photopolymer film. O consisted of a metal plate covered with white paper, with the paper side facing P. A square grid generated by black lines was present on the paper. The edge length of a square was 0.5 cm. This grid was imaged in the hologram on holographic exposure of P.

The average exposure dose Eave was set by the opening time t of S. With a fixed laser intensity I, therefore, t represented the variable that was proportional to Eave. Since the expanded laser beam possessed an inhomogeneous (bell-shaped) intensity distribution, there is variation in the local dose E for generating the hologram in P. This, together with the slanted position of P and O relative to the optical axis, means that the written hologram possessed an elliptical form. This is shown in FIG. 2.

Since O was a diffuse reflector, the hologram was easily reconstructed by illumination with a point light source (e.g. pocket lamp or LED lamp).

After the hologram had been exposed into the photopolymer film, the film was further laminated to glass and bleached under UV radiation. For this purpose, from an aluminium pouch with light-fast packaging, the samples were placed, with the glass side facing upwards, onto the conveyor belt of a UV unit, and were exposed twice at a belt speed of 2.5 m/min beneath a Fusion UV 558434 KR 85 lamp with a nominal power density of 80 W/cm², with an energy density on the photopolymer of approximately 2 J/cm².

Adhesive Products Used for Producing the Layers of Adhesive:

Adhesive 1 is an adhesive tape with the product code C 114 from Aslan, Schwarz GmbH & Co. KG, Overath, Germany (type: acrylate-based pressure-sensitive adhesive tape).

Adhesive 2 is an adhesive transfer tape with the product code Scotch K 9485 from 3M Deutschland GmbH, Neuss, Germany (type: pressure-sensitive adhesive tape based on modified acrylates).

Adhesive 3 is an adhesive transfer tape with the product code Scotch 9482 PC from 3M Deutschland GmbH, Neuss, Germany (type: pressure-sensitive adhesive tape based on modified acrylates).

Adhesive 4 is Levamelt® 700 from LANXESS Deutschland GmbH (type: hotmelt adhesive based on poly(ethylene-co-vinyl acetate)).

Adhesive 5 is Platilon HU2 from Epurex Films GmbH & Co. KG, Walsrode, Germany (type: melt sheet based on thermoplastic polyurethane).

Adhesive 6 is CoPET VA 334 080/09—experimental product from Epurex Films GmbH & Co. KG, Walsrode, Germany (type: melt sheet based on copolyester).

Adhesive 7 is MXCur 350 from CarTell UK Ltd., Corby, United Kingdom (type: UV-curing liquid adhesive based on acrylates).

Adhesive 8 is Araldite 2026 A from Huntsman Advanced Materials (Europe) BVBA, Everberg, Belgium (two-component liquid adhesive based on polyurethanes).

Adhesive 9 is an adhesive tape with the product code S11.628 from nolax AG, Sempach-Station, Switzerland (type: rubber-based pressure-sensitive adhesive tape).

Adhesive 10 is an adhesive transfer tape with the product code Vito 4050 from VITO Irmen GmbH & Co. KG, Remagen, Germany (type: pressure-sensitive adhesive tape based on rubber).

Adhesive 11 is an adhesive tape with the product code AF 24.449 from AF Adhäsive Formteile GmbH, Pfinztal, Germany (type: silicone-based pressure-sensitive adhesive tape).

Adhesive 12 is an experimental product from Bayer MaterialScience AG, Leverkusen, Germany, Dispercoll C VP LS 2372-1, liquid adhesive dispersion based on chloroprene.

Adhesive 13 is a mixture of 90% by weight Desmolux U 100 and 10% by weight Desmolux VP LS 2396, liquid adhesive based on urethane acrylates, experimental products from Bayer MaterialScience AG, Leverkusen, Germany.

Adhesive 14 is an adhesive transfer tape with the product code E5016C-DACH from 3M, St. Paul (Minnesota), USA (type: pressure-sensitive adhesive tape based on synthetic rubber).

Adhesive 15 is Oppanol® B 15 SFN from BASF SE, Ludwigshafen, Germany (type: hotmelt adhesive based on poly(isobutylene)).

Adhesive 16 is a hotmelt adhesive with the product code D41544 from Bühnen GmbH & Co. KG, Bremen, Germany (type: hotmelt adhesive based on polyolefin).

Adhesive 17 is WK-20 from Wekem GmbH, Werne, Germany (type: liquid adhesive based on cyanoacrylates).

Adhesive 18 is Cyberbond 2006 from Cyberbond Europe GmbH, Wunstorf, Germany (type: liquid adhesive based on cyanoacrylates).

Adhesive 19 is a mixture of 59.3% by weight Desmodur N 3800 and 40.7% by weight Desmophen 1100, liquid adhesive based on 2-component polyurethane, commercial products of Bayer MaterialScience AG, Leverkusen, Germany.

Adhesive 20 is Parker IA 25 from Parker Hannifin GmbH, Pleidelsheim, Germany (type: liquid adhesive based on cyanoacrylates).

Application of the Layers of Adhesive:

Different layers of adhesive were applied to the exposed photopolymer films. The techniques used were as follows:

i) Direct joining with adhesive/adhesive sheets, application either by manual roller or by hand.

ii) Application of a layer of a liquid adhesive mixture to a substrate to which the photopolymer film is to be joined. Directly thereafter the photopolymer film is applied to the layer of adhesive, and drying/curing takes place at elevated temperature and/or by UV radiation. Application may take place by spreading with a manual doctor blade or with an automatic doctor blade.

iii) Application of a liquid adhesive mixture to the area/sheet to which bonding is to take place; drying at 80° C. Application may take place by spreading with a manual doctor blade, or with an automatic doctor blade. After drying, the photopolymer layer is contacted with a laminating apparatus or a press, at suitable pressure/temperature, and subjected to pressing.

iv) Direct bonding to adhesive sheets at elevated temperature, using a roll laminator or a press, with appropriate pressure.

After storage for 7 days at room temperature and for 3 days at 60° C., after bonding, the colour change in the hologram was assessed with the naked eye, with appropriate illumination by a monochromatic LED (red, green, blue), white-light-LED or halogen lamp.

| Example | Adhesive | Application technique | Colour shift | ATR-IR measurement, time-dependent change in the absorption spectrum |
|---|---|---|---|---|
| C1 | 1 | i) | yes | — |
| C2 | 2 | i) | yes | yes |
| C3 | 3 | i) | yes | yes |
| C4 | 4 | iii) | yes | — |
| C5 | 5 | iv) | yes | — |
| C6 | 7 | ii) | yes | — |
| C7 | 19 | ii) | yes | yes |
| 1 | 6 | iv) | no | — |
| 2 | 8 | ii) | no | no |
| 3 | 9 | i) | no | — |
| 4 | 10 | i) | no | no |
| 5 | 11 | i) | no | — |
| 6 | 12 | iii) | no | — |
| 7 | 13 | ii) | no | no |
| 8 | 14 | i) | no | — |
| 9 | 15 | iii) | no | no |
| 10 | 16 | iii) | no | no |
| 11 | 17 | ii) | no | — |
| 12 | 18 | ii) | no | — |
| 13 | 20 | ii) | no | no |

The inventive laminates of Examples 1 to 13 did not exhibit any shift in wavelength by more than 20 nm; in other words, no colour shift was observed. In contrast, in the case of the laminates of Comparative Examples C1 to C7, a distinct colour shift was observed.

With the inventive laminates, the layer of adhesive acted as a diffusion barrier for the fluorourethane additive C). This was demonstrated by corresponding example ATR-IR measurements.

FIG. 3 shows the difference spectra obtained. In the case of the inventive layers of adhesive, there were no peaks in the difference spectrum for a change in absorbance by >3.2% during the measurement time.

The invention claimed is:

1. A laminate comprising an exposed photopolymer film and a layer of adhesive joined at least regionally to the photopolymer film, the photopolymer film comprising crosslinked polyurethane matrix polymers A), crosslinked writing monomers B) and a monomeric fluorourethane additive C), wherein the layer of adhesive is designed as a diffusion barrier for the fluorourethane additive C), wherein on an ATR-IR measurement there is no time-dependent change in the absorption spectrum and at no point in time an intensity difference of more than 3% in an absorption peak in a difference spectrum, if the layer of adhesive is wetted with the fluorourethane additive C), wherein the layer of adhesive comprises a urethane-based adhesive of high network density, which is obtained by reacting components that have number-average equivalent molar masses of <1500 g/mol.

2. The laminate according to claim 1, wherein the fluorourethane additive C) comprises of at least one compound of formula (I)

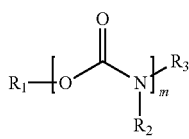

(I)

in which m≥1 and m≤8 and $R_1$, $R_2$ and $R_3$ independently of one another are hydrogen, linear, branched, cyclic or heterocyclic organic radicals which are unsubstituted or else, optionally, substituted by heteroatoms, where preferably at least one of the radicals $R_1$, $R_2$ and $R_3$ is substituted by at least one fluorine atom.

3. The laminate according to claim 2, wherein $R_1$ is an organic radical having at least one fluorine atom.

4. The laminate according to claim 1, wherein the photopolymer film further comprises a photoinitiator D) and/or a catalyst E).

5. The laminate according to claim 1, wherein the writing monomers B) are photochemically crosslinked acrylates.

6. The laminate according to claim 1, wherein the layer of adhesive has a thickness in the range from 3 to 100 µm.

7. The laminate according to claim 1, wherein the polyurethane matrix polymers A) are obtained by reaction of polyisocyanates a) and polyols b).

8. The laminate according to claim 1, wherein a hologram is exposed into the photopolymer film.

9. The laminate according to claim 1, wherein the layer of adhesive is joined over its full area to the photopolymer film.

10. The laminate according to claim 1, wherein it additionally has at least one cover layer, which may be joined to the layer of adhesive.

11. The laminate according to claim 1, wherein it additionally has at least one cover layer, which may be joined partably to the layer of adhesive.

12. A method for preparing an article comprising providing a polymer film, exposing a hologram into the polymer film, preparing the laminate according to claim 1, and integrating the laminate into the article, wherein the article is a chip card, an identity document or 3D image; a product protection tag; a label; a bank note, a strip or window; or a holographic optical element in a display.

13. The laminate according to claim 1, wherein a hologram exposed into the laminate does not exhibit a shift in wavelength by more than 20 nm after storage of the laminate for 7 days at room temperature and for 3 days at 60° C.

* * * * *